United States Patent
Chu et al.

(10) Patent No.: US 10,952,334 B2
(45) Date of Patent: Mar. 16, 2021

(54) POWER SUPPLY FIXING STRUCTURE

(71) Applicant: FSP TECHNOLOGY INC., Taoyuan (TW)

(72) Inventors: Ting-Chuan Chu, Taoyuan (TW); Chia-Lung Le, Taoyuan (TW)

(73) Assignee: FSP TECHNOLOGY INC., Taoyuan (TW)

( * ) Notice: Subject to any disclaimer, the term of this patent is extended or adjusted under 35 U.S.C. 154(b) by 0 days.

(21) Appl. No.: 16/294,954

(22) Filed: Mar. 7, 2019

(65) Prior Publication Data

US 2019/0297735 A1   Sep. 26, 2019

(30) Foreign Application Priority Data

Mar. 21, 2018 (CN) .......................... 201820388728.X

(51) Int. Cl.
  *A47B 81/00*   (2006.01)
  *H05K 5/00*   (2006.01)
  *H05K 5/02*   (2006.01)

(52) U.S. Cl.
  CPC .......... *H05K 5/0008* (2013.01); *H05K 5/0217* (2013.01)

(58) Field of Classification Search
  CPC ...... H05K 5/0008; H05K 5/0217; F16B 2/12; F16B 2/22; F16B 2/24; F16B 2/241; F16B 2/243; F16B 7/0473
  See application file for complete search history.

(56) References Cited

U.S. PATENT DOCUMENTS

| | | | | |
|---|---|---|---|---|
| 2,599,303 A | * | 6/1952 | Ward | A47G 33/105 248/229.26 |
| 5,297,598 A | * | 3/1994 | Rasmussen | G07D 9/004 141/314 |
| 5,452,743 A | * | 9/1995 | Rortvedt | E04D 13/08 137/615 |
| 6,288,332 B1 | * | 9/2001 | Liu | G06F 1/184 174/542 |
| 10,029,625 B1 | * | 7/2018 | Mejia Perez | B60J 5/0468 |
| 2009/0262498 A1 | * | 10/2009 | Chen | G06F 1/188 361/679.58 |
| 2010/0309611 A1 | * | 12/2010 | Fan | G06F 1/188 361/679.01 |
| 2016/0025263 A1 | * | 1/2016 | Gibbons | F16B 2/08 248/216.1 |
| 2016/0295725 A1 | * | 10/2016 | Wongjuntra | G06F 1/26 |
| 2017/0227977 A1 | * | 8/2017 | Hansen | G05B 15/02 |
| 2018/0326573 A1 | * | 11/2018 | Tesoroni | F16B 2/22 |

FOREIGN PATENT DOCUMENTS

DE    202012012290   *  1/2013

* cited by examiner

*Primary Examiner* — Matthew W Ing
(74) *Attorney, Agent, or Firm* — JCIPRNET

(57) ABSTRACT

A power supply fixing structure being suitable for connecting an elongated type power supply to a connection structure of a casing is provided. The power supply fixing structure includes a connecting component and an interconnect structure formed at an outer casing of the elongated type power supply. The connecting component includes a first connecting part for connecting to a connection structure and a second connecting part for connecting to the interconnect structure.

14 Claims, 6 Drawing Sheets

POWER SUPPLY FIXING STRUCTURE

CROSS-REFERENCE TO RELATED APPLICATION

This application claims the priority benefit of Chinese Application No. 201820388728.X, filed on Mar. 21, 2018. The entirety of the above-mentioned patent application is hereby incorporated by reference herein and made a part of this specification.

BACKGROUND

Technical Field

The disclosure relates to a fixing structure, and more particularly, to a power supply fixing structure suitable for fixing an elongated type power supply to a casing of a host computer.

Description of Related Art

Currently, common casings on the market can usually be equipped with an ATX (Advanced Technology Extended) power supply with a mounting length of 140 mm or a FLEX (Flexibility) power supply with a mounting length of 150 mm, and screw holes or copper posts are provided in a position corresponding to an end of the power supply inside the casing, so that the power supply can be locked in the casing.

With technological advances and cultural improvements, an elongated type ATX power supply and an elongated type FLEX power supply have come into existence and have a mounting length of 190 mm. The position of the common casing in which the screw holes or the copper posts are disposed is no longer compatible with the elongated type ATX power supply and the elongated type FLEX power supply, so that ends of the elongated ATX power supply and the elongated type FLEX power supply cannot be locked and therefore the problem of a power supply body sagging results.

Therefore, there is an urgent need for an elongated type power supply fixing structure to overcome the above defect.

SUMMARY

The disclosure provides an elongated type power supply fixing structure allowing an elongated type power supply to be locked to a common casing to overcome the problem of a power supply body sagging.

In order to achieve the above effect, a power supply fixing structure of the disclosure is suitable for connecting the elongated type power supply to a connection structure of the casing, and the power supply fixing structure includes a connecting component and an interconnect structure formed at an outer casing of the elongated type power supply. The connecting component includes a first connecting part configured to be connected to the connection structure and a second connecting part configured to be connected to the interconnect structure.

According to an embodiment of the disclosure, the interconnect structure is an aperture-shaped structure opposite to and aligned with the connection structure along the up and down direction of the casing.

According to an embodiment of the disclosure, the interconnect structure is a screw hole penetrating the top wall of the outer casing downwardly along the up and down direction of the casing. The connecting component is a screw including a screw head configured to form the first connecting part and a screw shank configured to form the second connecting part. The screw shank penetrates the connection structure downwardly along the up and down direction of the casing and is then connected to a screw thread of the screw hole.

According to an embodiment of the disclosure, the interconnect structure is a through hole penetrating the top wall and the bottom wall of the outer casing along the up and down direction of the casing. The connecting component is a screw including a screw head configured to form the second connecting part and a screw shank configured to form the first connecting part. The screw shank penetrates the through hole along the up and down direction of the casing and is then connected to a screw thread of the connection structure.

According to an embodiment of the disclosure, the interconnect structure includes a first hole and a second hole disposed on the top wall of the outer casing and connected with each other. The aperture of the first hole is greater than the aperture of the second hole. The connecting component is a screw including a screw head configured to form the second connecting part and a screw shank configured to form the first connecting part. A corresponding size of the screw head is smaller than the aperture of the first hole and greater than the aperture of the second hole. A corresponding size of the screw shank is smaller than the aperture of the second hole. When the screw head is stuck below the second hole, the screw shank is inserted in the second hole and is connected to a screw thread of the connection structure.

According to an embodiment of the disclosure, the first connecting part is located above the top wall of the outer casing and is opposite to the top wall of the outer casing, and a groove opposite to and aligned with the connection structure is disposed on the first connecting part.

According to an embodiment of the disclosure, the second connecting part includes an engaging part engaged with the interconnect structure.

According to an embodiment of the disclosure, the second connecting part is opposite to the side wall of the outer casing, the engaging part is arranged along the width direction of the casing, and the interconnect structure is located on the side wall of the outer casing.

According to an embodiment of the disclosure, one of the engaging part and the interconnect structure is a hook or an engaging pillar, and the other one of the engaging part and the interconnect structure is a hook groove or an engaging hole correspondingly.

According to an embodiment of the disclosure, the second connecting part is located on the top wall of the outer casing, the engaging part extends into the top wall of the outer casing, and the interconnect structure is located at the top wall of the outer casing.

According to an embodiment of the disclosure, one of the engaging part and the interconnect structure is a hook, and the other one of the engaging part and the interconnect structure is a hook groove.

According to an embodiment of the disclosure, the first connecting part and the second connecting part are each a sheet-shaped structure.

According to an embodiment of the disclosure, the first connecting part and the second connecting part are perpendicular to each other.

According to an embodiment of the disclosure, at least one of two opposite ends of the first connecting part extends downwardly to form the second connecting part.

Compared with the prior art, the power supply fixing structure of the disclosure connects the elongated type power supply to the connection structure of the casing stably and reliably (the connection structure has been standardized while the casing is designed and produced, that is, a size of the connection structure on the casing of each size has been set) via the interconnect structure formed at the outer casing of the elongated type power supply, the second connecting part configured to be connected to the interconnect structure and the first connecting part configured to be connected to the connection structure of the casing without changing the connection structure (e.g., copper posts or screw holes) of the casing, and at the same time, the disclosure further has advantages of a simple structure and strong practicality.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
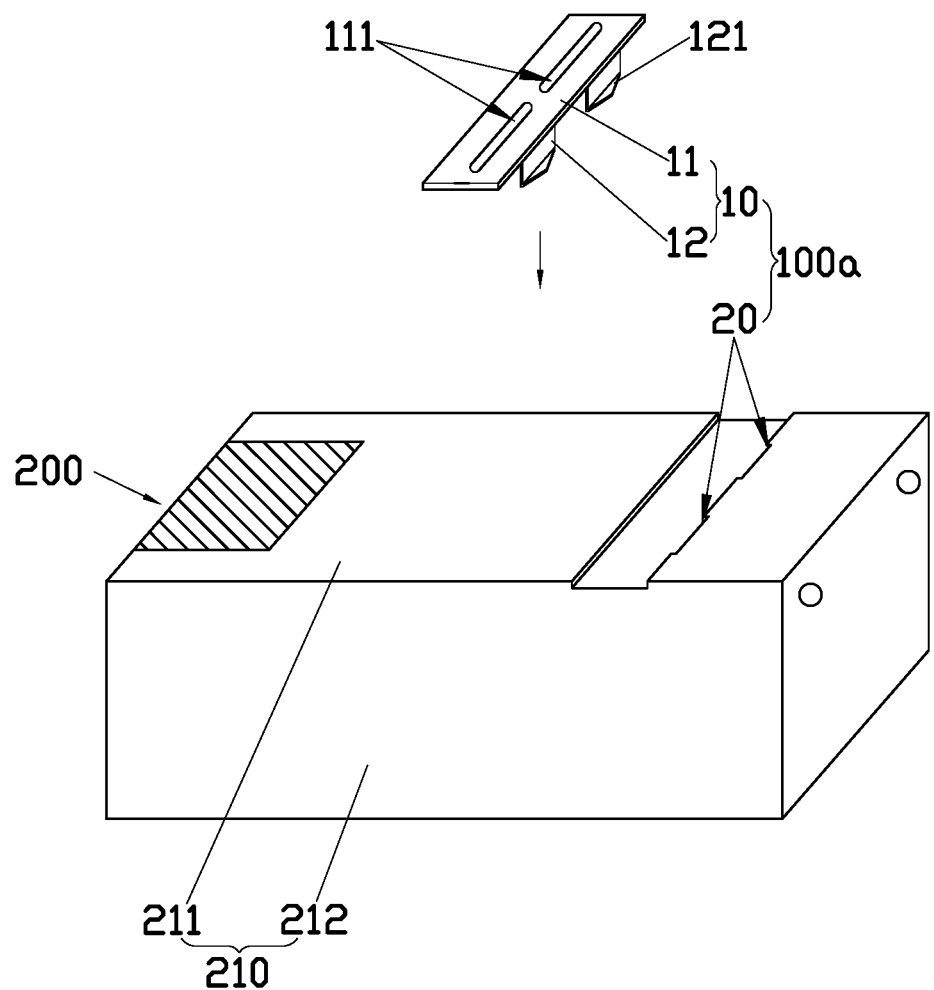
FIG. 1 is a perspective view of a power supply fixing structure according to a first embodiment of the disclosure configured to connect an elongated type ATX power supply to a casing.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, a power supply fixing structure 100a of a first embodiment is configured to connect an elongated type ATX power supply 200 to a connection structure (not shown) which is an original structure of a casing, and fixes the elongated type ATX power supply to the casing stably under the condition that no change is made to the connection structure of the casing. It can be understood that the connection structure of the casing is a pillar or a screw hole, but this is a well-known structure in the art, so relevant descriptions are omitted.

The power supply fixing structure 100a of the first embodiment includes a connecting component 10 and an interconnect structure 20 formed at an outer casing 210 of the elongated type ATX power supply 200. The connecting component 10 includes a first connecting part 11 configured to be connected to the connection structure and a second connecting part 12 configured to be connected to the interconnect structure 20. Specifically, the first connecting part 11 is located above the top wall 211 of the outer casing 210 and is opposite to the top wall 211 of the outer casing 210. A groove 111 opposite to and aligned with the connection structure is provided on the first connecting part 11 so as to allow the connection between the first connecting part 11 and the connection structure. For example, when the connection structure is a screw hole, components such as screws are inserted between the groove 111 and the screw hole at this moment to allow the connection between the first connecting part 11 and the connection structure; similarly, when the connection structure is a pillar, since the pillar has a screw thread cavity thereon, the first connecting part 11 is connected to the connection structure via the components such as screws inserted in the threaded cavity and the groove 111. More specifically, the first connecting part 11 and the second connecting part 12 are each a sheet-shaped structure capable of fixing the elongated type ATX power supply 200 preferably. The first connecting part 11 and the second connecting part 12 are perpendicular to each other to match a shape of the outer casing 210 of the elongated type ATX power supply 200 preferably. According to an embodiment of the disclosure, the first connecting part 11 is arranged along the width direction of the casing, and at least one of the two ends in the width direction of the first connecting part 11 are bended downwardly to form the second connecting part 12. The second connecting part 12 at the same end is arranged in pairs at an interval along the longitudinal direction of the first connecting part 11. According to an embodiment of the disclosure, the longitudinal direction of the second connecting part 12 is consistent with the longitudinal direction of the first connecting part 11, but the disclosure is not limited thereto. It should be noted that the longitudinal direction of the casing is consistent with the longitudinal direction of the outer casing 210, the width direction of the casing is consistent with the width direction of the outer casing 210, and the longitudinal direction of the first connecting part 11 is consistent with the width direction of the outer casing 210.

As shown in FIG. 1, the second connecting part 12 includes an engaging part 121. The second connecting part 12 is engaged with and connected to the interconnect structure 20 via the engaging part 121. Specifically, the engaging part 121 is located at the lower end of the second connecting part 12, the second connecting part 12 is located above the top wall 211 of the outer casing 210. The engaging part 121 extends into the top wall 211 of the outer casing 210, and is arranged along the longitudinal direction of the casing. According to an embodiment of the disclosure, since the second connecting part 12 at the same end is arranged in pairs at an interval along the longitudinal direction of the first connecting part 11, the engaging part 121 is evenly arranged on the second connecting part 12. The interconnect structure 20 is located at the top wall 211 of the outer casing 210. For example, the engaging part 121 is a hook, and the interconnect structure 20 is a hook groove. Depends on the actual requirement, the engaging part 121 may be a hook groove and the interconnect structure 20 may be a hook depending, but the disclosure is not limited thereto. When the second connecting part 12 is engaged with and connected to the interconnect structure 20 at the outer casing 210, the engaging part 121 is engaged into the interconnect structure 20, that is, the hook is engaged into the hook groove. In this way, the top wall 211 of the outer casing 210 is supported upwardly by the engaging part 121 to allow the connection between the outer casing 210 and the second connecting part 12. And then, the groove 111 on the first connecting part 11 is connected to the connection structure on the casing so as to fix the elongated type ATX power supply 200 to the casing.

Figure 2:
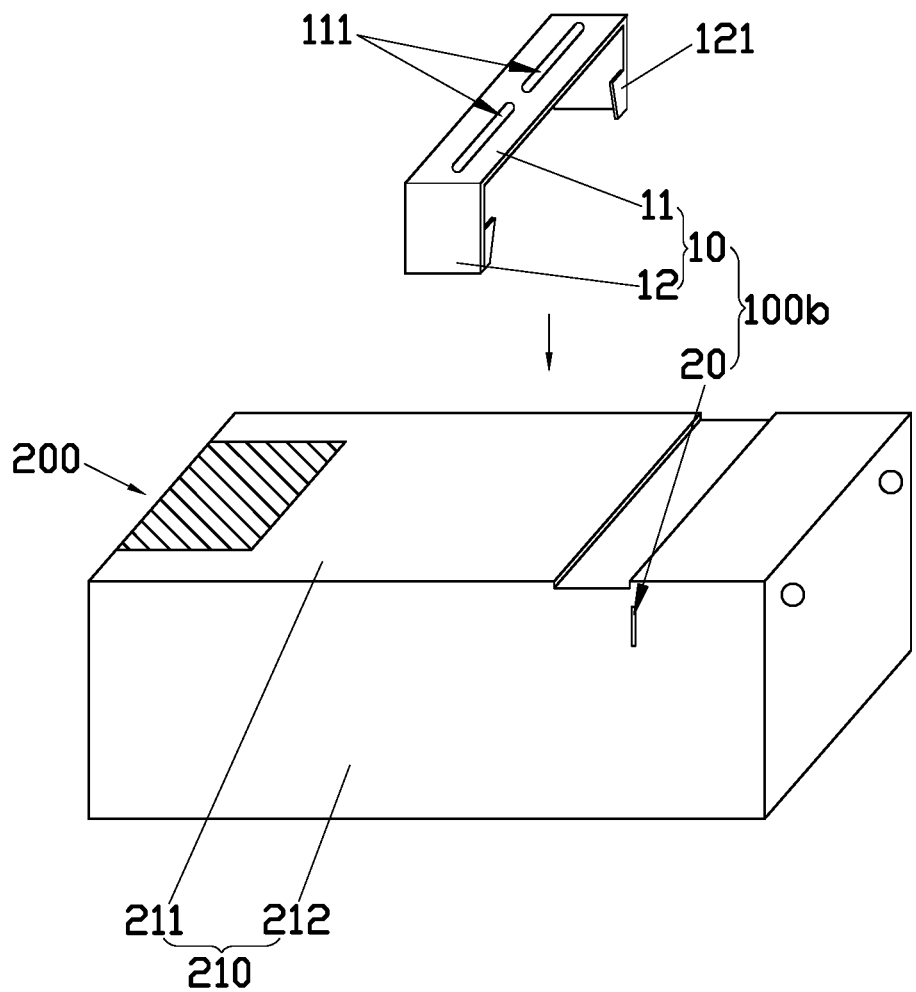
FIG. 2 is a perspective view of a power supply fixing structure according to a second embodiment of the disclosure configured to connect an elongated type ATX power supply to a casing.

Referring to FIG. 2, a second embodiment of the power supply fixing structure of the disclosure configured to be connected to the elongated type ATX power supply is illustrated. A power supply fixing structure 100b of the embodiment has fundamentally the same structure as the power supply fixing structure 100a of the first embodiment. The following are the differences.

First, in the present embodiment, the second connecting part 12 is opposite to the side wall 212 of the outer casing 210, so the second connecting part 12 is formed by an end of the first connecting part 11 in the longitudinal direction extending downwardly. Correspondingly, the interconnect structure 20 is located on the side wall 212 of the casing 210. According to an embodiment of the disclosure, two ends of the first connecting part 11 in the longitudinal direction extend downwardly respectively to form the second connecting parts 12, but the disclosure is not limited thereto. The engaging part 121 is arranged along the width direction of the casing. Since there are two second connecting parts 12, each second connecting part 12 has one engaging part 121, but the disclosure is not limited thereto. In the first embodiment, the second connecting part 12 is located above the top wall 211 of the outer casing 210, and the engaging part 121 extends into the top wall 211 of the outer casing 210. The engaging part 121 is arranged along the longitudinal direction of the casing. Correspondingly, the interconnect structure 20 is located at the top wall 211 of the outer casing 210.

Except the above differences, other aspects are the same as the aspects of the first embodiment and therefore relevant descriptions are omitted.

Figure 3:
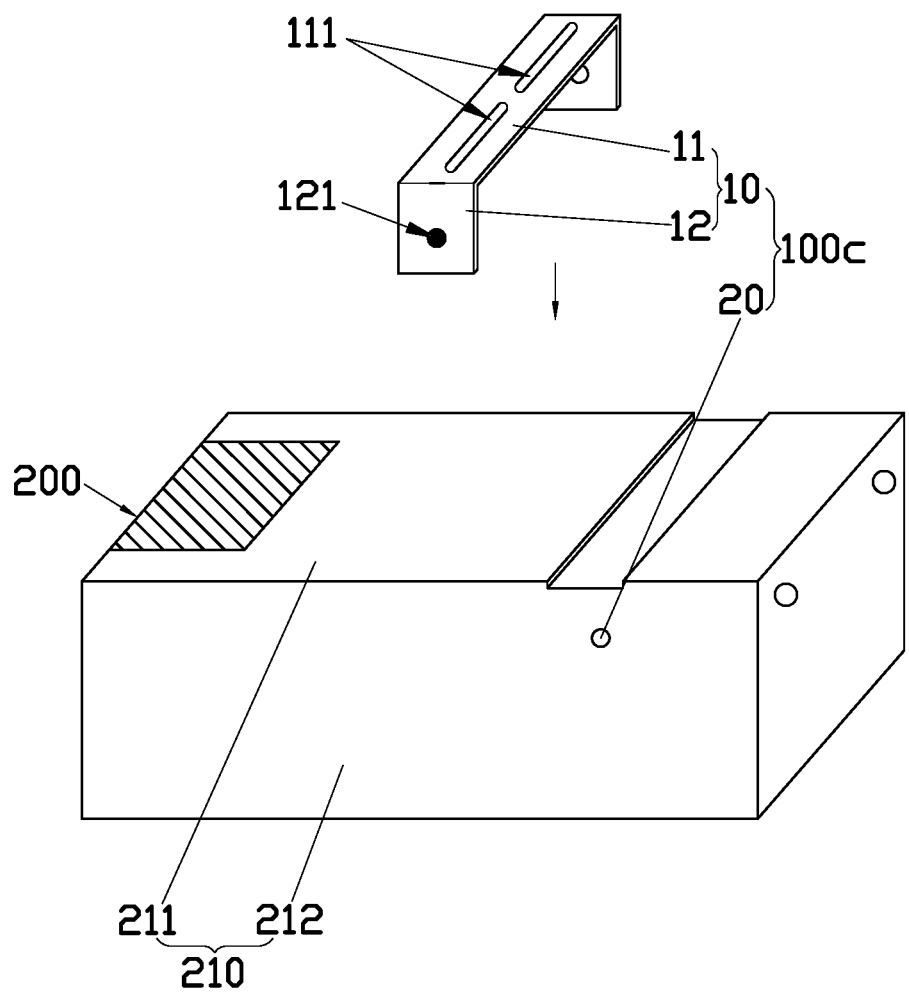
FIG. 3 is a perspective view of a power supply fixing structure according to a third embodiment of the disclosure configured to connect an elongated type ATX power supply to a casing.

Referring to FIG. 3, a third embodiment of the power supply fixing structure of the disclosure configured to be connected to the elongated type ATX power supply is illustrated. A power supply fixing structure 100c of the embodiment has fundamentally the same structure as the power supply fixing structure 100b of the second embodiment. The following are the differences.

In the present embodiment, the engaging part 121 is an engaging hole and the interconnect structure 20 is an engaging pillar correspondingly. Depends on the actual requirement, the engaging part 121 may be an engaging pillar and the interconnect structure 20 may be an engaging hole correspondingly, but the disclosure is not limited thereto. In the second embodiment, the engaging part 121 is a hook and the interconnect structure 20 is a hook groove.

Except the above differences, other aspects are the same as the aspects of the power supply fixing structure 100b of the second embodiment and therefore relevant descriptions are omitted.

Figure 4:
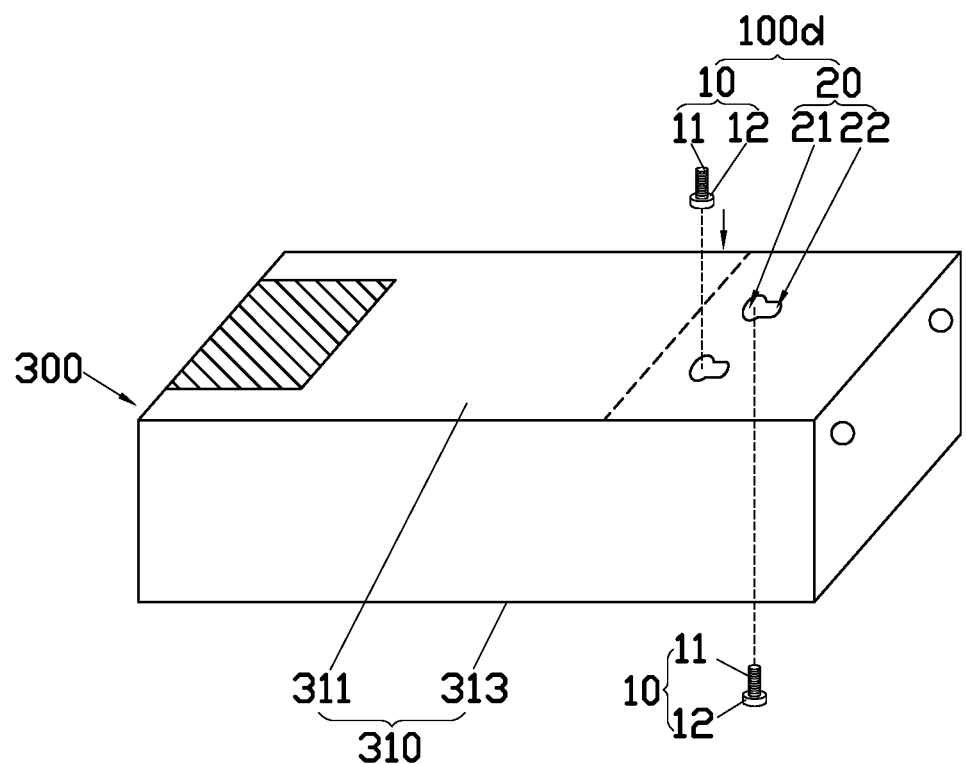
FIG. 4 is a perspective view of a power supply fixing structure according to a fourth embodiment of the disclosure configured to connect an elongated type FLEX power supply to a casing.

Referring to FIG. 4, a fourth embodiment of the power supply fixing structure of the disclosure configured to be connected to an elongated type FLEX power supply is illustrated. A power supply fixing structure 100d of the embodiment includes the connecting component 10 and the interconnect structure 20 formed at the outer casing 310 of the elongated type FLEX power supply 300. The connecting component 10 includes the first connecting part 11 configured to be connected to the connection structure and the second connecting part 12 configured to be connected to the interconnect structure 20. In the present embodiment, the interconnect structure 20 is an aperture-shaped structure opposite to and aligned with the connection structure along the up and down direction of the casing. Specifically, the interconnect structure 20 includes a first hole 21 and a second hole 22 which are disposed on the top wall 311 of an outer casing 310 and are connected with each other, wherein the aperture of the first hole 21 is greater than the aperture of the second hole 22. The connecting component 10 is a screw including a screw head configured to form the second connecting part 12 and a screw shank configured to form the first connecting part 11, wherein a corresponding size of the screw head is smaller than the aperture of the first hole 21 and greater than the aperture of the second hole 22. A corresponding size of the screw shank is smaller than the aperture of the second hole 22. When the screw head is stuck below the second hole 22, the screw shank is inserted in the second hole 22 at this moment and is connected to a screw thread of a connection structure (such as a screw hole) to assembly the elongated type FLEX power supply 300 and the casing together quickly and detach the elongated type FLEX power supply 300 from the casing quickly. Note that the power supply fixing structure 100d of the fourth embodiment is also suitable for connecting the elongated type ATX power supply 200 to the casing as long as the interconnect structure 20 on the elongated type ATX power supply 200 has the structure described in the present embodiment, and an arrangement of the structure on the elongated type ATX power supply 200 is as described in the present embodiment. Accordingly, an applicable range of the power supply fixing structure 100d of the fourth embodiment cannot be limited by the above case.

Figure 5:
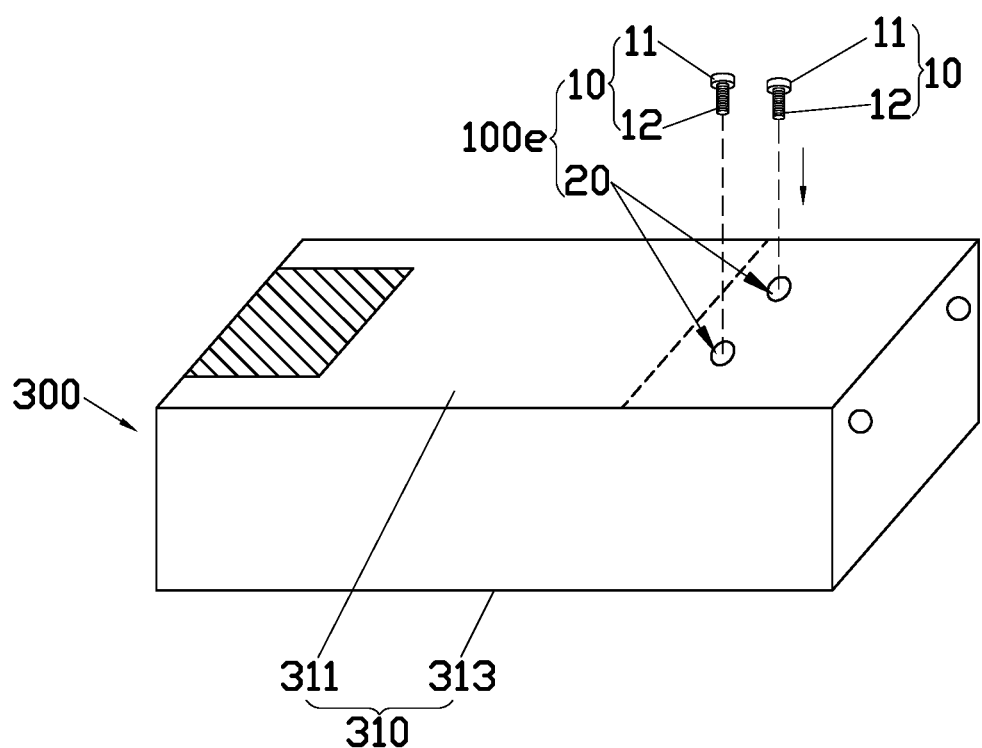
FIG. 5 is a perspective view of a power supply fixing structure according to a fifth embodiment of the disclosure configured to connect an elongated type FLEX power supply to a casing.

Referring to FIG. 5, a fifth embodiment of the power supply fixing structure of the disclosure configured to be connected to the elongated type FLEX power supply is illustrated. A power supply fixing structure 100e of the embodiment is fundamentally the same as the structure of the fourth embodiment. The following are the differences.

In the present embodiment, the interconnect structure 20 is a screw hole penetrating the top wall 311 of the outer casing 310 downwardly along the up and down direction of the casing. The connecting component 10 is a screw including a screw head configured to form the first connecting part 11 and a screw shank configured to form the second connecting part 12, the screw shank penetrates the connection structure (such as the screw hole of the casing) downwardly along the up and down direction of the casing and is then connected to a screw thread of the screw hole. At this moment, the screw head is pressed against the top of the connection structure to fix the elongated type FLEX power supply 300 to the casing. In the fourth embodiment, the interconnect structure 20 includes the first hole 21 and the second hole 22 which are disposed on the top wall 311 of the outer casing 310 and are connected with each other, wherein the aperture of the first hole 21 is greater than the aperture of the second hole 22. The connecting component 10 is a screw including a screw head configured to form the second connecting part 12 and a screw shank configured to form the first connecting part 11, wherein the corresponding size of the screw head is smaller than the aperture of the first hole 21 and greater than the aperture of the second hole 22. The corresponding size of the screw shank is smaller than the aperture of the second hole 22. When the screw head is stuck below the second hole 22, the screw shank is inserted in the second hole 22 at this moment and is connected to screw thread of the connection structure (such as a screw hole) to assembly the elongated type FLEX power supply 300 and the casing together quickly and detach the elongated type FLEX power supply 300 from the casing quickly.

Except the above differences, other aspects are the same as the aspects of the fourth embodiment and therefore relevant descriptions are omitted.

Figure 6:
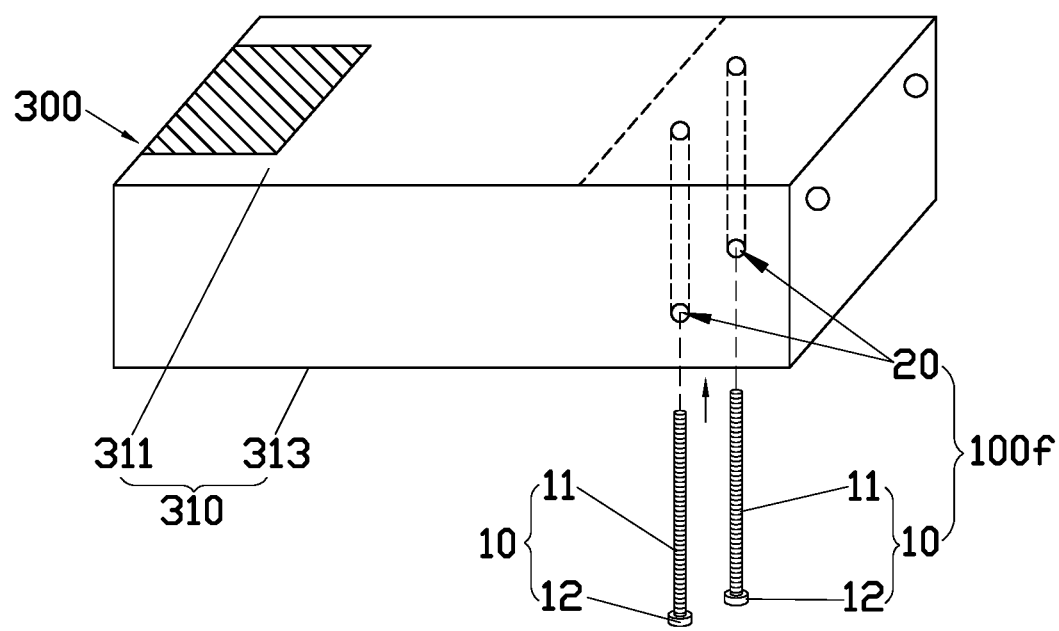
FIG. 6 is a perspective view of a power supply fixing structure according to a sixth embodiment of the disclosure configured to connect an elongated type FLEX power supply to a casing.

Referring to FIG. 6, a sixth embodiment of the power supply fixing structure of the disclosure configured to be connected to the elongated type FLEX power supply is illustrated. A power supply fixing structure 100f of the embodiment is fundamentally the same as the structure of the fifth embodiment. The following are the differences.

First, in the present embodiment, the interconnect structure 20 is a through hole penetrating the top wall 311 and the bottom wall 313 of the outer casing 310 along the up and down direction of the casing, the connecting component 10 is a screw including a screw head configured to form the second connecting part 12 and a screw shank configured to form the first connecting part 11, and the screw shank penetrates the through hole upwardly along the up and down direction of the casing and is then connected to a screw thread of the connection structure. The screw head is pressed against the bottom wall 313 of the outer casing 310. It is sure that, in other embodiments, the screw has the screw head configured to form the first connecting part 11 and the screw shank configured to form the second connecting part 12, the screw shank penetrates the connection structure and the through hole in sequential along the up and down direction of the casing downwardly, and is then connected to the screw thread of the screw hole to fix the elongated type FLEX power supply 300 to the outer casing. However, the disclosure is not limited thereto.

In the fifth embodiment, the interconnect structure 20 is a screw hole penetrating the top wall 311 of the outer casing 310 downwardly along the up and down direction of the casing, the connecting component 10 is a screw including the screw head configured to form the first connecting part 11 and the screw shank configured to form the second connecting part 12. The screw shank penetrates the connection structure (e.g., the screw hole of the casing) downward along the up and down direction of the casing and is then connected to the screw thread of the screw hole. At this moment, the screw head is pressed against the top part of the connection structure to fix the fixed type FLEX power supply 300 to the casing.

Except the above differences, other aspects are the same as the aspects of the fifth embodiment and therefore relevant descriptions are omitted.

Compared with the prior art, the power supply fixing structures 100a to 100f of the disclosure connect the elongated type ATX power supply 200 and the elongated type FLEX power supply 300 to the connection structure (which has been standardized while the casing is designed and produced, that is, a size of the connection structure on the casing of each size has been set) of the casing stably and reliably via the interconnect structure 20 formed at the outer casings 210 and 310 of the elongated type power supplies, the second connecting part 12 configured to be connected to the interconnect structure 20, and the first connecting part 11 configured to be connected to the connection structure of the casing without changing the connection structure (such as a copper post or a screw hole) of the casing, and meanwhile, the disclosure further has advantages of a simple structure and strong practicality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power supply fixing structure suitable for connecting an elongated power supply to a connection structure of a casing, the power supply fixing structure comprising a connecting component and an interconnect structure formed at an outer casing of the elongated power supply, wherein the connecting component comprises a first connecting part configured to be connected to the connection structure and a second connecting part configured to be connected to the interconnect structure, wherein the first connecting part is fully overlapped with the outer casing and a length of the first connecting part exceeds 150 mm.

2. The power supply fixing structure of claim 1, wherein the interconnect structure is an aperture-shaped structure opposite to and aligned with the connection structure along the up and down direction of the casing.

3. The power supply fixing structure of claim 2, wherein the interconnect structure is a screw hole penetrating the top wall of the outer casing downwardly along the up and down direction of the casing, and the connecting component is a screw including a screw head configured to form the first connecting part and a screw shank configured to form the second connecting part, wherein the screw shank penetrates the connection structure downwardly along the up and down direction of the casing and is then connected to a screw thread of the screw hole.

4. The power supply fixing structure of claim 2, wherein the interconnect structure is a through hole penetrating the top wall and the bottom wall of the outer casing along the up and down direction of the casing, and the connecting component is a screw including a screw head configured to form the second connecting part and a screw shank configured to form the first connecting part, wherein the screw shank penetrates the through hole along the up and down direction of the casing and is then connected to a screw thread of the connection structure.

5. The power supply fixing structure of claim 2, wherein the interconnect structure comprises a first hole and a second hole disposed on the top wall of the outer casing and connected with each other, wherein the aperture of the first hole is greater than the aperture of the second hole, the connecting component is a screw including a screw head configured to form the second connecting part and a screw shank configured to form the first connecting part, a corresponding size of the screw head is smaller than the aperture of the first hole and greater than the aperture of the second hole, and a corresponding size of the screw shank is smaller than the aperture of the second hole, wherein when the screw head is stuck below the second hole, the screw shank is inserted in the second hole and is connected to a screw thread of the connection structure.

6. The power supply fixing structure of claim 1, wherein the first connecting part is located above the top wall of the outer casing and is opposite to the top wall of the outer casing, and a groove opposite to and aligned with the connection structure is disposed on the first connecting part.

7. The power supply fixing structure of claim 6, wherein the second connecting part has an engaging part engaged with the interconnect structure.

8. The power supply fixing structure of claim 7, wherein the second connecting part is opposite to the side wall of the outer casing, the engaging part is arranged along the width direction of the casing, and the interconnect structure is located on the side wall of the outer casing.

9. The power supply fixing structure of claim 8, wherein one of the engaging part and the interconnect structure is a hook or an engaging pillar, and the other one of the engaging part and the interconnect structure is a hook hole groove or an engaging hole correspondingly.

10. The power supply fixing structure of claim 7, wherein the second connecting part is located on the top wall of the outer casing, and the engaging part extends into the top wall of the outer casing, wherein the interconnect structure is located at the top wall of the outer casing.

11. The power supply fixing structure of claim 10, wherein one of the engaging part and the interconnect structure is a hook, and the other one of the engaging part and the interconnect structure is a hook groove.

12. The power supply fixing structure of claim 6, wherein the first connecting part and the second connecting part are each a sheet-shaped structure.

13. The power supply fixing structure of claim 6, wherein the first connecting part is perpendicular to the second connecting part.

14. The power supply fixing structure of claim 6, wherein at least one of two opposite ends of the first connecting part extends downwardly to form the second connecting part.

\* \* \* \* \*